(12) United States Patent
Mamrak et al.

(10) Patent No.: US 10,919,218 B2
(45) Date of Patent: Feb. 16, 2021

(54) INTERLACE CALIBRATION AND METHODS OF USE THEREOF

(71) Applicant: GENERAL ELECTRIC COMPANY, Schenectady, NY (US)

(72) Inventors: Justin Mamrak, Loveland, OH (US); Zachary Fieldman, Marina Del Ray, OH (US)

(73) Assignee: General Electric Company, Schenectady, NY (US)

( * ) Notice: Subject to any disclaimer, the term of this patent is extended or adjusted under 35 U.S.C. 154(b) by 484 days.

(21) Appl. No.: 15/807,439

(22) Filed: Nov. 8, 2017

(65) Prior Publication Data
US 2019/0134892 A1 May 9, 2019

(51) Int. Cl.
| | |
|---|---|
| *B29C 64/153* | (2017.01) |
| *B29C 64/393* | (2017.01) |
| *B33Y 50/02* | (2015.01) |
| *B33Y 30/00* | (2015.01) |
| *B22F 3/105* | (2006.01) |
| *B33Y 10/00* | (2015.01) |
| *H01S 5/06* | (2006.01) |

(52) U.S. Cl.
CPC .......... *B29C 64/153* (2017.08); *B22F 3/1055* (2013.01); *B29C 64/393* (2017.08); *B33Y 10/00* (2014.12); *B33Y 30/00* (2014.12); *B33Y 50/02* (2014.12); *B22F 2003/1057* (2013.01); *B22F 2999/00* (2013.01); *H01S 5/06* (2013.01)

(58) Field of Classification Search
CPC .............................. B29C 64/153; B33Y 50/02
USPC ............................................................ 419/5
See application file for complete search history.

(56) References Cited

U.S. PATENT DOCUMENTS

| | | | |
|---|---|---|---|
| 3,627,922 A | 12/1971 | Goldmark et al. | |
| 4,863,538 A | 9/1989 | Deckard | |
| 5,182,055 A | 1/1993 | Allison et al. | |
| 5,460,758 A | 10/1995 | Langer et al. | |
| 7,295,281 B2 | 11/2007 | Duffield et al. | |
| 7,680,555 B2 | 3/2010 | Dunn et al. | |

(Continued)

FOREIGN PATENT DOCUMENTS

| | | | |
|---|---|---|---|
| DE | 102016106403 A1 * | 10/2017 | ............. B23K 26/34 |
| WO | 2017174226 A1 | 10/2017 | |

OTHER PUBLICATIONS

International Search Report and Written Opinion for application PCT/US2018/050564 dated Jan. 10, 2019 (16 pages).

*Primary Examiner* — Weiping Zhu
(74) *Attorney, Agent, or Firm* — Dinsmore & Shohl LLP

(57) ABSTRACT

A method, apparatus, and program for calibrating an additive manufacturing apparatus. In one aspect, a method is disclosed for calibrating an additive manufacturing apparatus. The method includes forming a first solidified portion within a first scan region, wherein the solidified portion within the first scan region is formed by irradiating a build material while a build unit is in a first location. The method further includes forming a second solidified portion within a second scan region, wherein the second solidified portion within the second scan region is formed by irradiating a build material while a build unit is in a second location different from said first location. An alignment of the additive manufacturing apparatus determined based on the detected alignment of the first solidified portion and the second solidified portion.

13 Claims, 6 Drawing Sheets

(56) References Cited

U.S. PATENT DOCUMENTS

| | | |
|---|---|---|
| 7,713,454 B2 | 5/2010 | Larsson |
| 8,780,390 B2 | 7/2014 | Seto et al. |
| 2009/0060386 A1 | 3/2009 | Cooper et al. |
| 2015/0123320 A1 | 5/2015 | Joyce |
| 2016/0227184 A1 | 8/2016 | Nims et al. |
| 2016/0236279 A1 | 8/2016 | Ashton et al. |
| 2017/0045877 A1 | 2/2017 | Shapiro et al. |
| 2017/0085733 A1 | 3/2017 | Ilic et al. |
| 2017/0090461 A1 | 3/2017 | Chong et al. |
| 2019/0134747 A1* | 5/2019 | Herzog ................ B23K 26/354 |

* cited by examiner

INTERLACE CALIBRATION AND METHODS OF USE THEREOF

TECHNICAL FIELD

The disclosure relates to an improved method and apparatus for Interlace calibration in an additive manufacturing apparatus.

BACKGROUND

Additive manufacturing (AM) techniques may include electron beam freeform fabrication, laser metal deposition (LMD), laser wire metal deposition (LMD-w), gas metal arc-welding, laser engineered net shaping (LENS), laser sintering (SLS), direct metal laser sintering (DMLS), electron beam melting (EBM), powder-fed directed-energy deposition (DED), and three dimensional printing (3DP), as examples. AM processes generally involve the buildup of one or more materials to make a net or near net shape (NNS) object in contrast to subtractive manufacturing methods. Though "additive manufacturing" is an industry standard term (ASTM F2792), AM encompasses various manufacturing and prototyping techniques known under a variety of names, including freeform fabrication, 3D printing, rapid prototyping/tooling, etc. AM techniques are capable of fabricating complex components from a wide variety of materials. Generally, a freestanding object can be fabricated from a computer aided design (CAD) model. As an example, a particular type of AM process uses an energy beam, for example, an electron beam or electromagnetic radiation such as a laser beam, to sinter or melt a powder material and/or wire-stock, creating a solid three-dimensional object in which a material is bonded together.

Selective laser sintering, direct laser sintering, selective laser melting, and direct laser melting are common industry terms used to refer to producing three-dimensional (3D) objects by using a laser beam to sinter or melt a fine powder. For example, U.S. Pat. Nos. 4,863,538 and 5,460,758 describe conventional laser sintering techniques. More specifically, sintering entails fusing (agglomerating) particles of a powder at a temperature below the melting point of the powder material, whereas melting entails fully melting particles of a powder to form a solid homogeneous mass. The physical processes associated with laser sintering or laser melting include heat transfer to a powder material and then either sintering or melting the powder material. Electron beam melting (EBM) utilizes a focused electron beam to melt powder. These processes involve melting layers of powder successively to build an object in a metal powder.

FIG. 1 is schematic diagram showing a cross-sectional view of an exemplary conventional system 110 for direct metal laser sintering (DMLS) or direct metal laser melting (DMLM). The apparatus 110 builds objects, for example, the part 122, in a layer-by-layer manner (e.g. layers L1, L2, and L3, which are exaggerated in scale for illustration purposes) by sintering or melting a powder material (not shown) using an energy beam 136 generated by a source such as a laser 120. The powder to be melted by the energy beam is supplied by reservoir 126 and spread evenly over a build plate 114 using a recoater arm 116 travelling in direction 134 to maintain the powder at a level 118 and remove excess powder material extending above the powder level 118 to waste container 128. The energy beam 136 sinters or melts a cross sectional layer (e.g. layer L1) of the object being built under control of the galvo scanner 132. The build plate 114 is lowered and another layer (e.g. layer L2) of powder is spread over the build plate and object being built, followed by successive melting/sintering of the powder by the laser 120. The process is repeated until the part 122 is completely built up from the melted/sintered powder material. The laser 120 may be controlled by a computer system including a processor and a memory. The computer system may determine a scan pattern for each layer and control laser 120 to irradiate the powder material according to the scan pattern. After fabrication of the part 122 is complete, various post-processing procedures may be applied to the part 122. Post processing procedures include removal of excess powder, for example, by blowing or vacuuming, machining, sanding or media blasting. Further, conventional post processing may involve removal of the part 122 from the build platform/substrate through machining, for example. Other post processing procedures include a stress release process. Additionally, thermal and chemical post processing procedures can be used to finish the part 122.

The abovementioned AM processes is controlled by a computer executing a control program. For example, the apparatus 110 includes a processor (e.g., a microprocessor) executing firmware, an operating system, or other software that provides an interface between the apparatus 110 and an operator. The computer receives, as input, a three dimensional model of the object to be formed. For example, the three dimensional model is generated using a computer aided design (CAD) program. The computer analyzes the model and proposes a tool path for each object within the model. The operator may define or adjust various parameters of the scan pattern such as power, speed, and spacing, but generally does not program the tool path directly. One having ordinary skill in the art would fully appreciate the abovementioned control program may be applicable to any of the abovementioned AM processes. Further, the abovementioned computer control may be applicable to any subtractive manufacturing or any pre or post processing techniques employed in any post processing or hybrid process.

When forming a component using an AM process, various process parameters of the AM apparatus during a layer-by-layer build can have a significant impact on the quality of the component and the dimensional accuracy of the completed component. AM apparatuses have a significant number of components which all must be calibrated to create consistent and dimensionally accurate components. For example, an in the abovementioned apparatus, a galvanometer may be used to direct a laser beam to fuse a region of powder during each layer of the build. In the example correct calibration of the galvanometer is critical to assure an accurate build. Further, in the AM apparatus disclosed below, there also exists a need to calibrate the movement of a build unit and/or a build platform. Thus, the current invention relates to an AM apparatus and method of calibrating an AM apparatus.

SUMMARY OF THE INVENTION

In one aspect, a method is disclosed for calibrating an additive manufacturing apparatus. The method includes forming a first solidified portion within a first scan region, wherein the solidified portion within the first scan region is formed by irradiating a build material while a build unit is in a first location. The method further includes forming a second solidified portion within a second scan region, wherein the second solidified portion within the second scan region is formed by irradiating a build material while a build unit is in a second location different from said first location. An alignment of the additive manufacturing apparatus updated based on the detected alignment of the first solidified portion and the second solidified portion.

In another aspect, a method for calibrating an additive manufacturing apparatus is disclosed. The calibration method may include forming a first solidified portion within a first scan region, wherein the solidified portion within the first scan region is formed by irradiating a build material while a build unit is in a first location. Further, a second solidified portion is formed within a second scan region, wherein the second solidified portion within the second scan region is formed by irradiating a build material while the build unit is in a second location different from said first location. The apparatus is calibrated based on at least one of the following but not limited to; a degree of offset of the first and second solidified portion, a skew between the frames, and a degree of overlap of the first and second solidified portion.

In another aspect a non-transitory computer readable medium storing a program configured to cause a computer to execute a calibration method for an additive manufacturing apparatus is disclosed. The calibration method includes forming a first solidified portion within a first scan region, wherein the solidified portion within the first scan region is formed by irradiating a build material while a build unit is in a first location. The calibration method further includes forming a second solidified portion within a second scan region, wherein the second solidified portion within the second scan region is formed by irradiating a build material while the build unit is in a second location different from said first location. The apparatus is calibrated based on at least one of the following but not limited to; a degree of offset of the first and second solidified portion, a skew between the frames, and a degree of overlap of the first and second solidified portion.

BRIEF DESCRIPTION OF THE DRAWINGS

The accompanying drawings, which are incorporated into and constitute a part of this specification, illustrate one or more example aspects of the present disclosure and, together with the detailed description, serve to explain their principles and implementations.

DETAILED DESCRIPTION

While the aspects described herein have been described in conjunction with the example aspects outlined above, various alternatives, modifications, variations, improvements, and/or substantial equivalents, whether known or that are or may be presently unforeseen, may become apparent to those having at least ordinary skill in the art. Accordingly, the example aspects, as set forth above, are intended to be illustrative, not limiting. Various changes may be made without departing from the spirit and scope of the disclosure. Therefore, the disclosure is intended to embrace all known or later-developed alternatives, modifications, variations, improvements, and/or substantial equivalents.

Figure 1:
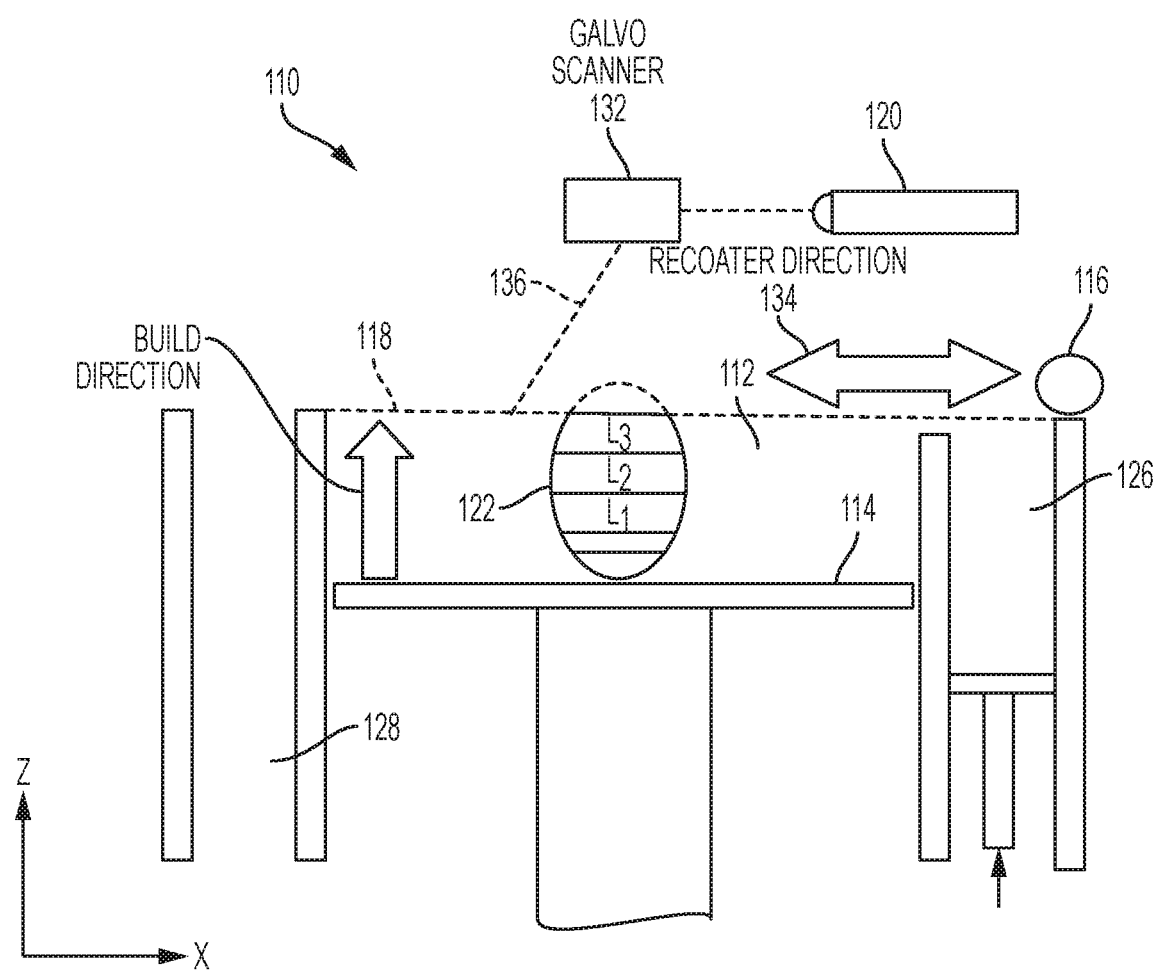
FIG. 1 is a side view diagram of a conventional additive manufacturing technique used to form at least part of a component.
Figure 2:
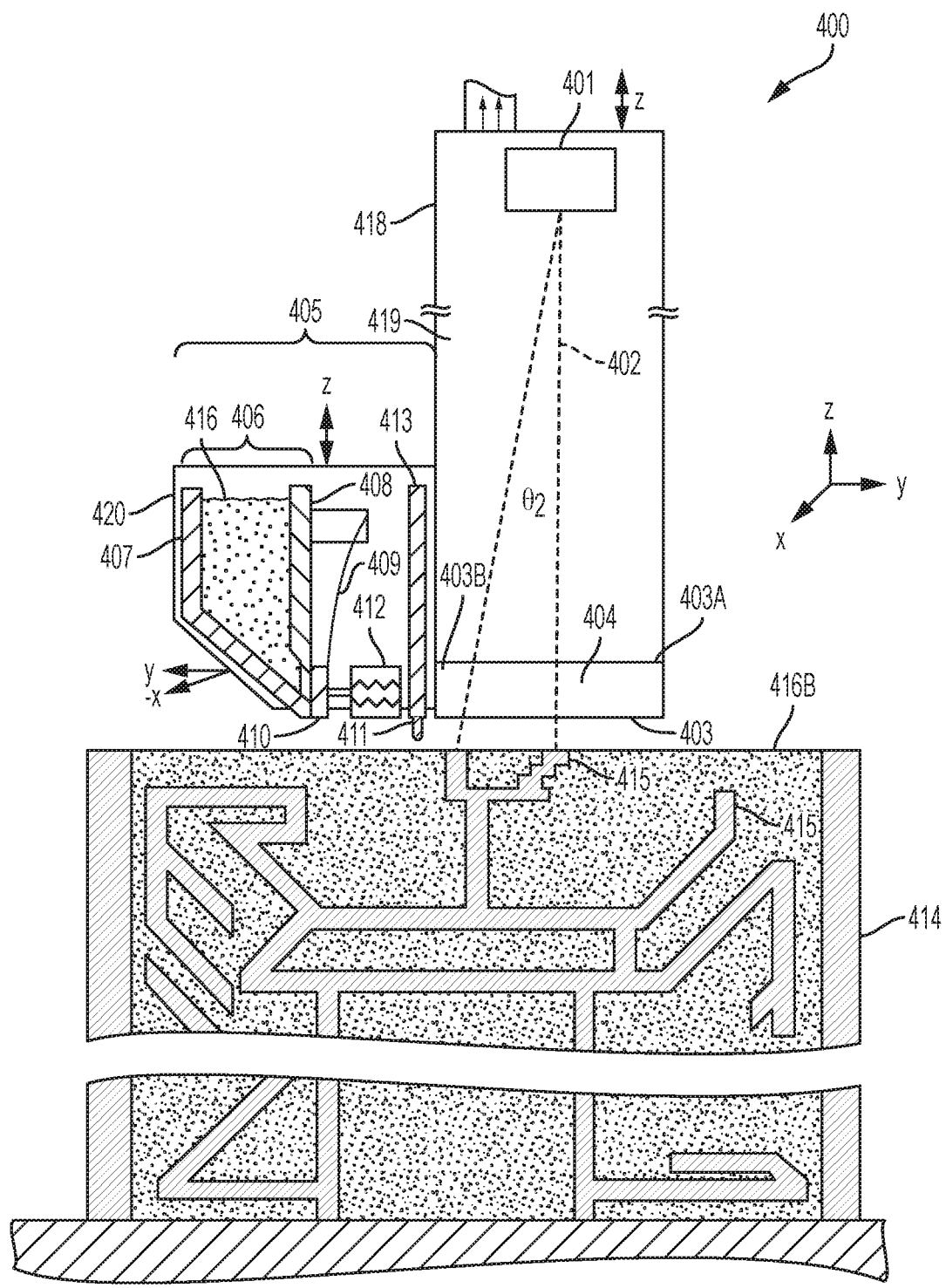
FIG. 2 is a side view cross section of a build unit in accordance with one aspect of the disclosure.

FIG. 2 shows an example of one embodiment of a large-scale AM apparatus usable with the present invention. The apparatus comprises a positioning system (not shown), a build unit 400 comprising an irradiation emission directing device 401, a laminar gas flow zone 404, and a build plate (not shown) beneath an object being built 415. The maximum build area is defined by the positioning system (not shown), instead of by a powder bed as with conventional systems, and the build area for a particular build can be confined to a build envelope 414 that may be dynamically built up along with the object. In general, the positioning system used in the present invention may be any multidimensional positioning system such as a gantry system, a delta robot, cable robot, robot arm, etc. The irradiation emission directing device 401 may be independently moved inside of the build unit 400 by a second positioning system (not shown). The atmospheric environment outside the build unit, i.e. the "build environment," or "containment zone," may be controlled such that the oxygen content is reduced relative to typical ambient air, and so that the environment is at reduced pressure. In some embodiments, the recoater used is a selective recoater. One embodiment of a selective recoater 411 is illustrated in FIG. 2. It is noted that while FIG. 2 shows an example, the current invention is also applicable to a single stationary scanner, a plurality of stationary scanners, and/or a plurality of stationary and/or mobile build units.

There may also be an irradiation source that, in the case of a laser source, originates the photons comprising the laser irradiation that is directed by the irradiation emission directing device. When the irradiation source is a laser source, then the irradiation emission directing device may be, for example, a galvo scanner, and the laser source may be located outside the build environment. Under these circumstances, the laser irradiation may be transported to the irradiation emission directing device by any suitable means, for example, a fiber-optic cable. When the irradiation source is an electron source, then the electron source originates the electrons that comprise the e-beam that is directed by the irradiation emission directing device. When the irradiation source is an electron source, then the irradiation emission directing device may be, for example, a deflecting coil. When a large-scale additive manufacturing apparatus according to an embodiment of the present invention is in operation, if the irradiation emission directing devices directs a laser beam, then generally it is advantageous to include a gasflow device 404 providing substantially laminar gas flow zone. An electron-beam may also be used in instead of the laser or in combination with the laser. An e-beam is a well-known source of irradiation. For example, U.S. Pat. No. 7,713,454 to Larsson titled "Arrangement and Method for Producing a Three-Dimensional Product" ("Larsson") discusses e-beam systems, and is incorporated herein by reference.

The gasflow device 404 may provide gas to a pressurized outlet portion (not shown) and a vacuum inlet portion (not shown) which may provide gas flow to a gasflow zone 403, and a recoater 405. Above the gasflow zone 404 there is an enclosure 418 which may contain an inert environment 419. The recoater 405 may include a hopper 406 comprising a back plate 407 and a front plate 408. The recoater 405 also has at least one actuating element 409, at least one gate plate 410, a recoater blade 411, an actuator 412, and a recoater arm 413. The recoater is mounted to a mounting plate 420. FIG. 2 also shows a build envelope 414 that may be built by, for example, additive manufacturing or Mig/Tig welding, an object being formed 415, and powder 416 contained in the hopper 405 used to form the object 415. In this particular example, the actuator 412 activates the actuating element 409 to pull the gate plate 410 away from the front plate 408. In an embodiment, the actuator 412 may be, for example, a pneumatic actuator, and the actuating element 409 may be a bidirectional valve. In an embodiment, the actuator 412 may be, for example, a voice coil, and the actuating element 409 may be a spring. There is also a hopper gap 417 between the front plate 408 and the back plate 407 that allows powder to flow when a corresponding gate plate is pulled away from the powder gate by an actuating element. The powder 416, the back plate 407, the front plate 408, and the gate plate 410 may all be the same material. Alternatively, the back plate 407, the front plate 408, and the gate plate 410 may all be the same material, and that material may be one that is compatible with any desired material, such as cobalt-chrome for example. In this particular illustration of one embodiment of the present invention, the gas flow in the gasflow zone 404 flows in the x direction, but could also flow in any desired direction with respect to the build unit. The recoater blade 411 has a width in the x direction. The direction of the irradiation emission beam when $\theta_2$ is approximately 0 defines the z direction in this view. The gas flow in the gasflow zone 404 may be substantially laminar. The irradiation emission directing device 401 may be independently movable by a second positioning system (not shown). This illustration shows the gate plate 410 in the closed position.

Further it is noted that while the abovementioned selective powder recoating mechanism 405 only includes a single powder dispenser, the powder recoating mechanism may include multiple compartments containing multiple different material powders are also possible.

When the gate plate 410 in the open position, powder in the hopper is deposited to make fresh powder layer 521, which is smoothed over by the recoater blade 511 to make a substantially even powder layer. In some embodiments of the present invention, the substantially even powder layer may be irradiated at the same time that the build unit is moving, which would allow for continuous operation of the build unit and thus faster production of the object.

Figure 3:
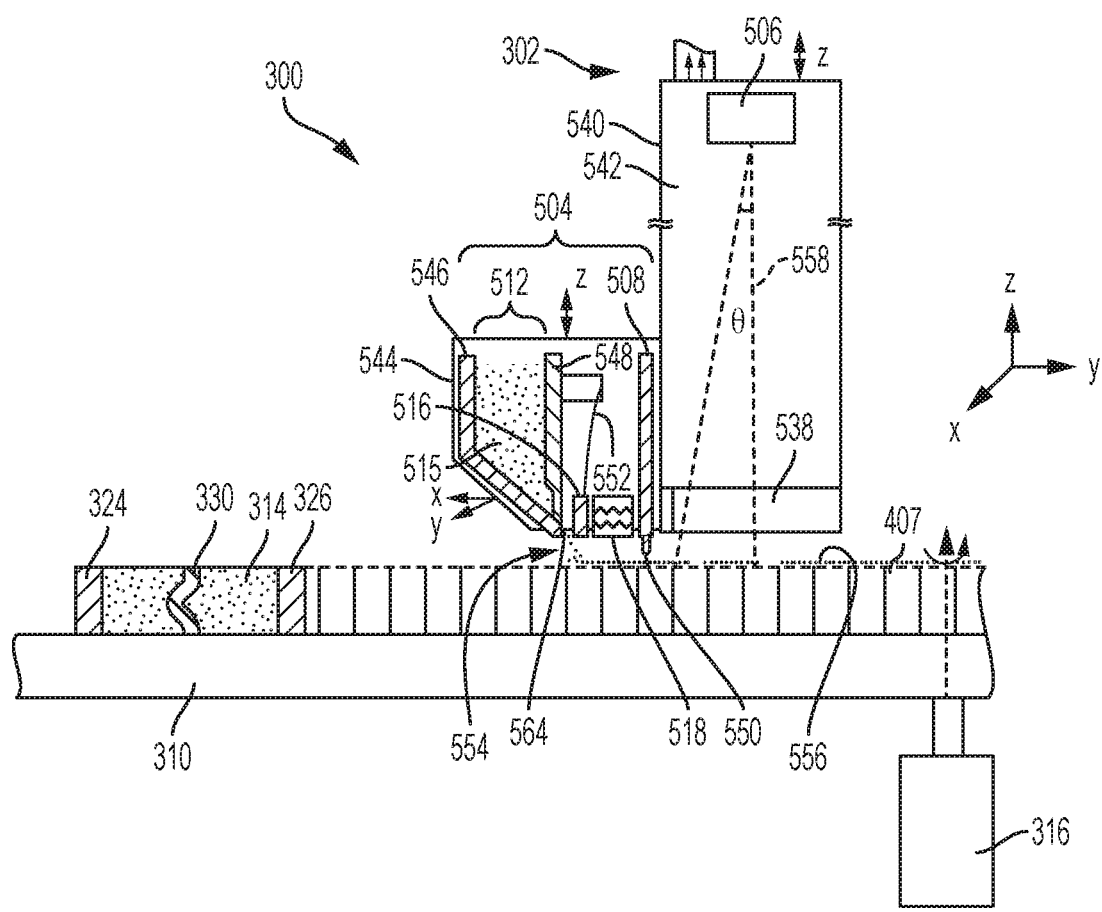
FIG. 3 is a side view cross section of a build unit and part of the rotating build platform of an additive manufacturing apparatus in accordance with one aspect of the disclosure.

FIG. 3 shows a side view of a manufacturing apparatus 300 including details of the build unit 302, which is pictured on the far side of the build platform. The mobile build unit 302 includes an irradiation beam directing mechanism 506, a gas-flow mechanism 532 with a gas inlet and gas outlet (not shown) providing gas flow to a gas flow zone in direction 538, and a powder recoating mechanism 504. In this example, the flow direction is substantially along the X direction. Above the gas flow zone 538, there may be an enclosure 540 that contains an inert environment 542. The powder recoating mechanism 504, which is mounted on a recoater plate 544, has a powder dispenser 512 that includes a back plate 546 and a front plate 548. The powder recoating mechanism 504 also includes at least one actuating element 552, at least one gate plate 516, a recoater blade 550, an actuator 518 and a recoater arm 508. In this embodiment, the actuator 518 activates the actuating element 552 to pull the gate plate 516 away from the front plate 548, as shown in FIG. 3. There is also a gap 564 between the front plate 548 and the gate plate 516 that allows the powder to flow onto the rotating build platform 310 when the gate plate 516 is pulled away from the front plate 548 by the actuating element 552. The rotating build platform 310 may be rotatably controlled by a motor 316.

FIG. 3 shows a build unit 302 with the gate plate 516 at an open position. The powder 515 in the powder dispenser 512 is deposited to make a fresh layer of powder 554, which is smoothed over a portion of the top surface (i.e. build or work surface) of the rotating build platform 310 by the recoater blade 510 to make a substantially even powder layer 556 which is then irradiated by the irradiation beam 558 to a fused layer that is part of the printed object 330. In some embodiments, the substantially even powder layer 556 may be irradiated at the same time as the build unit 302 is moving, which allows for a continuous operation of the build unit 302 and hence, a more time-efficient production of the printed or grown object 330. The object being built 330 on the rotating build platform 310 is shown in a powder bed 314 constrained by an outer build wall 324 and an inner build wall 326. In this particular illustration of one embodiment of the present invention, the gas flow in the gasflow zone 532 flows in the x direction, but could also flow in any desired direction with respect to the build unit.

It is noted that while the abovementioned selective powder recoating mechanism 504 only includes a single powder dispenser, the powder recoating mechanism may include multiple compartments containing multiple different material powders are also possible.

Additional details for a build units and positioning mechanisms for a single and/or multiple units that can be used in accordance with the present invention may be found in U.S. patent application Ser. No. 15/610,177, titled "Additive Manufacturing Using a Mobile Build Volume," filed May 31, 2017; U.S. patent application Ser. No. 15/609,965, titled "Apparatus and Method for Continuous Additive Manufacturing," filed May 31, 2017; U.S. patent application Ser. No. 15/610,113, titled "Method for Real-Time Simultaneous Additive and Subtractive Manufacturing With a Dynamically Grown Build Wall," filed May 31, 2017; U.S. patent application Ser. No. 15/610,214, titled "Method for Real-Time Simultaneous and Calibrated Additive and Subtractive Manufacturing," filed May 31, 2017; U.S. patent application Ser. No. 15/609,747, titled "Apparatus and Method for Real-Time Simultaneous Additive and Subtractive Manufacturing with Mechanism to Recover Unused Raw Material," filed May 31, 2017; U.S. patent application Ser. No. 15/406,444, titled "Additive Manufacturing Using a Dynamically Grown Build Envelope," filed Jan. 13, 2017; U.S. patent application Ser. No. 15/406,467, titled "Additive Manufacturing Using a Mobile Build Volume," filed Jan. 13, 2017; U.S. patent application Ser. No. 15/406,454, titled "Additive Manufacturing Using a Mobile Scan Area," filed Jan. 13, 2017; U.S. patent application Ser. No. 15/406,461, titled "Additive Manufacturing Using a Selective Recoater," filed Jan. 13, 2017; U.S. patent application Ser. No. 15/406,471, titled "Large Scale Additive Machine," filed Jan. 13, 2017, the disclosures of which are incorporated herein by reference.

One advantage of the abovementioned additive machines is that, in some embodiments, the build plate may be vertically stationary (i.e. in the z direction). This permits the build plate to support as much material as necessary, unlike the prior art methods and systems, which require some mechanism to raise and lower the build plate, thus limiting the amount of material that can be used. Accordingly, large scale additive machines are particularly suited for manufacturing an object within a large build envelope. With respect to the build envelope, precision and quality of the envelope may be relatively unimportant, such that rapid build techniques are advantageously used. In general, the build envelope may be built by any suitable means, for instance by Mig or Tig welding, or by laser powder deposition. If the wall is built by additive manufacturing, then a different irradiation emission directing device can be used to build than wall than is used to build the object. This is advantageous because building the wall may be done more quickly with a particular irradiation emission directing device and method, whereas a slower and more accurate directing device and method may be desired to build the object.

Figure 4:
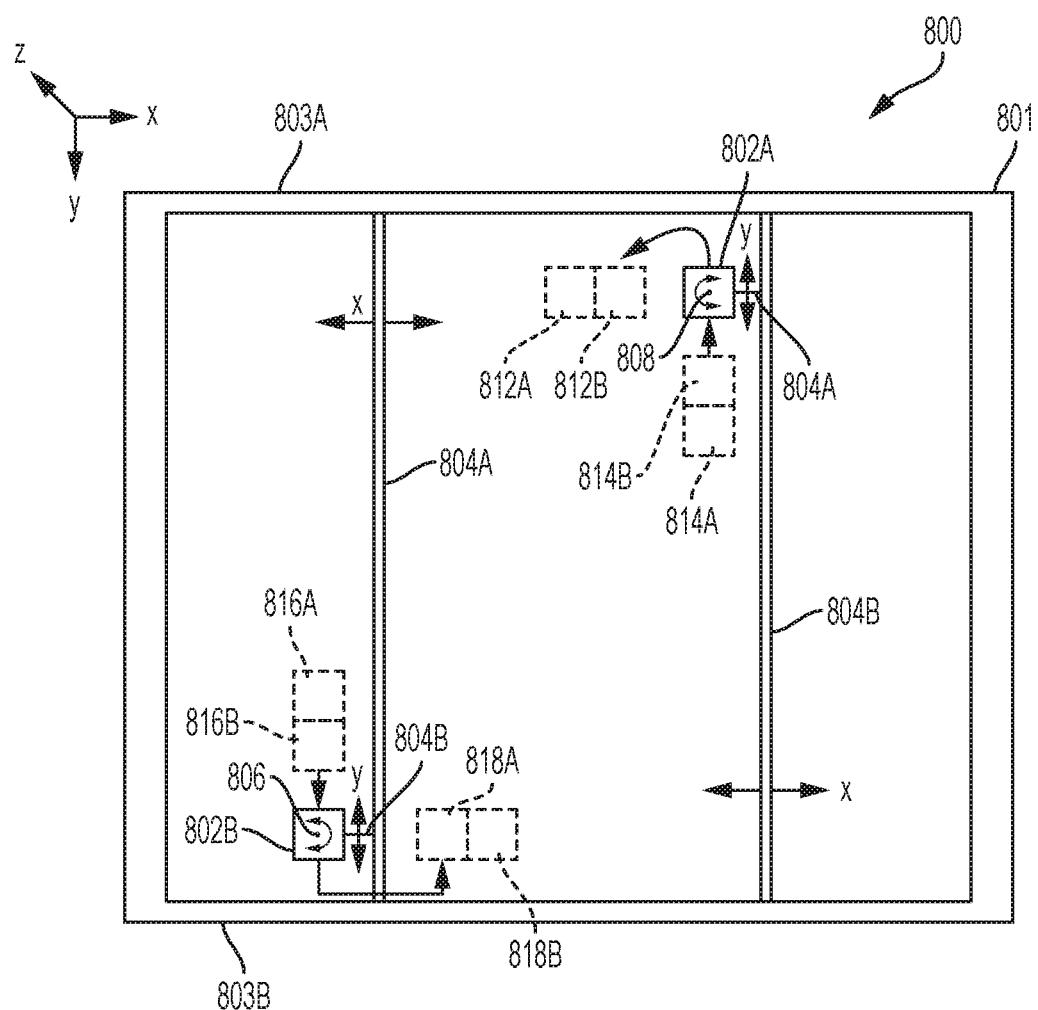
FIG. 4 is a simplified top view of a large scale additive manufacturing apparatus with two build units according to an aspect of the disclosure.

For example, as shown in FIG. 4, the systems and methods of the present invention may use two or more build units to build one or more object(s). The number of build units, objects, and their respective sizes are only limited by the physical spatial configuration of the apparatus. FIG. 8 shows a top down view of a large-scale additive manufacturing machine 800 according to an embodiment of the invention. There are two build units 802A and 802B mounted to a positioning system 801. There are z crossbeams 803A and 803B for moving the build units in the z direction. There are x crossbeams 804A and 804B for moving the build units in the x direction. The build units 802A and 802B are attached to the x crossbeams 804A and 804B by mechanisms 805A and 805B that move the units in the y direction. The object(s) being formed are not shown in this view. A build envelope (also not shown in this view) can be built using one or both of the build units, including by laser powder deposition. The build envelope could also be built by, e.g., welding. In general, any number of objects and build envelopes can be built simultaneously using the methods and systems of the present invention.

As mentioned above, a build unit (e.g. as shown in FIGS. 2 and 3) and/or multiple build units may be used to selectively provide a build material (e.g. powder) and at least partially melt or sinter the build material within a scan region. As the size of the component being manufactured using the AM apparatus increases, portions of the component may require a build unit to move to another scan zone. Further, portions of the build may require two or more scan zones to be connected to form a single larger at least partially solidified layer of the AM build. One simplified example is shown in FIG. 4. In FIG. 4, two build units 802A and 802B are mounted to a positioning system 801 which may allow the build units to move along an x, y, and z direction. Further, the positioning system 801 may allow the build units to rotate about axis 806 and 808. The positioning system may rely on a series of motors and sensors to move the build unit(s) precisely. For example, as shown in FIG. 4, A build unit 802A may fuse a region within a scan zone 812A. The build unit 802 may then move to a second scan zone 812B to fuse a second portion of the build to form a larger fused region within both scan zones 812A and 812B. Similarly, the build unit may fuse a region within a scan zone 814A and then may move to fuse a second portion of the build to form a larger fused region within both scan zones 814A and 814B. A build unit 802B may fuse a region within a scan zone 816A. The build unit 802B may then move to a second scan zone 816B to fuse a second portion of the build to form a larger fused region within both scan zones 816A and 816B. Further, it is possible to form a first fused region within a scan zone 818B using build unit 802B and form a second portion of the fused region within a scan zone 818A using build unit 802A. As the abovementioned example scenarios illustrate, fusing a layer of the AM build using a mobile build unit and/or multiple build units requires precise positioning of the build units. Thus, it becomes increasingly important to assure that the motors and sensors that move the build units are precisely calibrated. Further, it may also be necessary to assure that the galvanometer scanner, laser, and/or e-beam is calibrated to assure that the fused region within each scan zone matches up and properly meshes with a connected fused region within a subsequent scan zone.

Further, when a AM apparatus as shown in FIG. 3 is used. It may further be necessary to calibrate the mobile build platform 310. Accordingly, the invention is applicable to typical AM machines, as well as AM machines having mobile build unit(s) and mobile build unit(s) used in conduction with a mobile build platform (e.g. as shown in FIG. 3).

As mentioned above, a build unit (e.g. as shown in FIGS. 2 and 3) is used to selectively provide a build material (e.g. powder) and at least partially melt or sinter the build material within a scan region. As the size of the component being manufactured using the AM apparatus increases, portions of the component may require a build unit to move to another scan zone. Further, portions of the build may require two or more scan zones to be connected to form a single larger at least partially solidified layer of the AM build.

Figure 5:
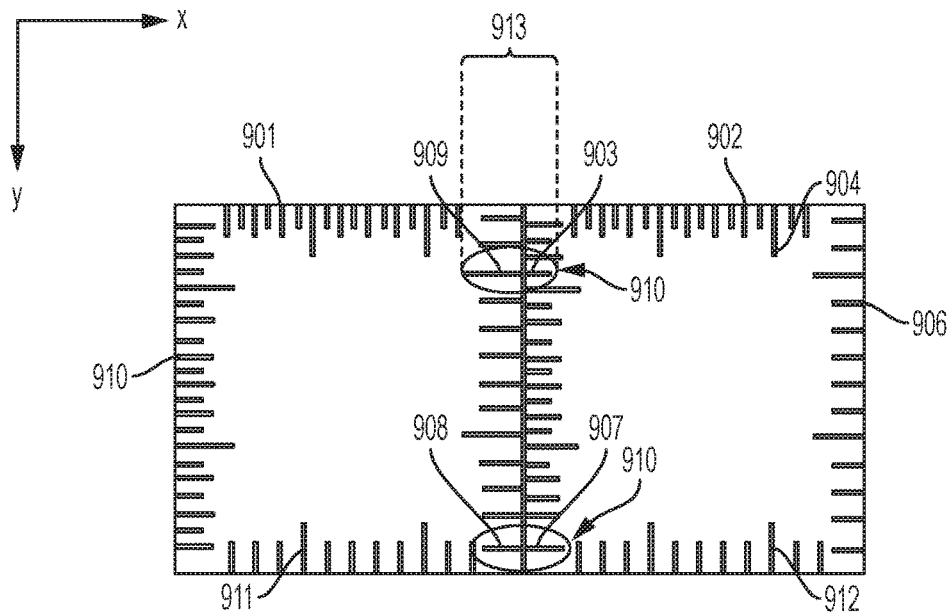
FIG. 5 is a top view showing an example an interlace calibration region within two adjacent scan zones in accordance with one aspect of the disclosure.

In order to calibrate the positioning system and/or the scanning system, as shown in FIG. 5, a first scan zone 901 may be formed near a second scan zone 902 at two different positions of the same build unit or using two build units. While FIG. 5 shows square scan zones, it is noted that the invention is not limited as such. For instance in the aspect shown with a mobile (e.g., rotating build platform), as shown in FIG. 3, the scan zones may be pie shaped or may include two arc shaped and/or circular borders and two linear borders for example. Further, in another aspect, the scan zones may be triangular shaped, circular, oval, or any other shape which may be selected based on the object being formed during the AM process. Thus, one having ordinary skill in the art would understand that methods mentioned throughout are applicable to any shaped scan zone having any shaped border. The first scan zone may represent a portion of a scan-able region at a first location of the build unit (e.g. build units 400 and/or 302 as shown in FIGS. 2 and 3) and/or may represent a first position of the build platform 310 shown in FIG. 3 with respect to the build unit 302, for example. A second scan zone 902 may represent a portion of a scan-able region at a second location of the build unit (e.g. build units 400 and/or 302 as shown in FIGS. 2 and 3) and/or may represent a second position of the build platform 310 shown in FIG. 3 with respect to the build unit 302, for example. A scan-able region may represent a surface area over which the irradiation source is capable of at least partially fusing a build material at a specific location of the build unit. For example, with reference to FIG. 2, a scan-able region may include a surface area of the powder 416B and/or fused region 415 over which the irradiation source 402 is capable of operating (e.g. capable of fusing and/or sintering the build material) while the build unit 400 is in a single orientation with respect to the build surface 415 and/or 416B. In other words regions 901 and 902, may represent a surface that is at least a portion of a total scan-able region while a build unit and/or platform is in a single stationary orientation.

As shown in FIG. 4, each of the scan regions may be selected by software which divides each layer of a desire AM build into build unit positions and raster-scan regions.

Each scan region 812A-B, 814A-B, 816A-B and/or 818A-B may be formed using a series of solidification lines (not shown). Additional details for scan strategies that can be used in accordance with the present invention may be found in U.S. patent application Ser. No. 15/451,108, titled "Triangle Hatch Pattern for Additive Manufacturing," filed Mar. 7, 2017; U.S. patent application Ser. No. 15/451,043, titled "Leg Elimination Strategy for Hatch Pattern," filed Mar. 6, 2017; U.S. patent application Ser. No. 15/459,941, titled "Constantly Varying Hatch for Additive Manufacturing," filed Mar. 15, 2017, the disclosures of which are incorporated herein by reference.

In order to calibrate the positioning system and/or the scanning system, as shown in FIG. 5, a first scan zone 902 may be formed with a series of markings as solidification lines 902, 903, 906, 907, and/or 912 near a second scan zone 901 at two different positions of the same build unit or using two build units. A second scan zone 901, may be formed with a series of markings as solidification lines 901, 908, 909, 910, and/or 911. The scales on respective scan fields may be used to either visually (manually) and/or use a detector to determine an offset between the scan fields. Accordingly, once the offset is determined, a correction may be made to compensate for the deviation. Such a compensation may for example be an offset value at which to control the build unit(s) and/or if the deviation is detected and/or visually seen as too great, it may be determined that manual re-calibration of the AM machine is necessary.

It is noted that throughout the specification the term "solidified" and "solidification" is used. However, solidification is not limited to the actual melting and solidification of a build material. For example, the markings mentioned throughout may be formed by decreasing an irradiation source power (i.e. through decrease in wattage, defocusing of the irradiation source and/or by increasing the speed at which the markings are formed). Accordingly, the term solidification and solidified may be used interchangeably with and may comprise the darkening, marking or forming marks in the build material instead of an actual solidification of the build material. In one example, the markings may be formed at a decreased irradiation source power so as to merely darken the build material (i.e. powder). By forming the solidification lines as marks using the abovementioned decreased power, the marked and/or darkened powder may be removed using a recoater and replaced with fresh powder once an alignment operation is completed. As an alternative, the abovementioned marked and/or darkened powder may be retained in the build material and fully and/or partially solidified as a portion of the built component once an alignment operation has been performed.

The abovementioned series of markings 902, 903, 906, 907, and/or 912 in the first scan zone 902 and/or the series of markings 901, 908, 909, 910, and/or 911 in the second scan zone may be formed as solidification lines in a Vernier scale. Forming the abovementioned solidification lines in a scale allows smaller deviations between each scan field to be detected without the need for significant magnification. The solidification lines may be spaced at a constant fraction of a fixed main scale. As one example, each solidification line within each of scan zones 902 and 901 may be spaced at nine tenths of a main scale in each scan zone. Accordingly, when the two scan zones 902 and 901 are adjacently formed, together with zero points aligned, the first mark in each scan zone scale is one tenth short of the first main scale mark etc. Thus, in the abovementioned example there would be an alignment when a full ten marks are counted. If the scan zones 902 and 901 are misaligned by a small amount, for example, one tenth of main scale formed as solidification lines, the only pair of marks that would be aligned would be the first pair, since these were the only ones originally misaligned by one tenth. Similarly, if the two scan zones are misaligned by five tenths, the fifth pair of scan lines would be in alignment, for example. As stated above, by using the Vernier principle to form solidification lines in each scan zone, smaller deviations between each scan field can be detected with less magnification. For example, as shown in FIG. 5, it may be easier to detect an alignment between marks 908, 907, 903, and/or 909 than to simply detect a misalignment between a single line segment in each field. Thus by determining which solidification lines are in alignment, an offset in the Y direction can be determined. Further, the solidification lines 909 and 903 may have a known length, thus a distance 913 can be measured to detect a dimensional offset in an x direction in the example shown in FIG. 5. It is noted that while the abovementioned example discloses the scale formed as solidification lines as Vernier scale, the marking in each field may also be a single marking having an offset between the markings of each field being measured. Further, the scale and interval of the markings may be any desired pattern or scheme which would allow the offset of two or more adjacent or near-adjacent scan fields to be measured.

It is noted that the markings 902, 903, 906, 907, and/or 912 in the first scan zone 902 and/or the series of markings 901, 908, 909, 910, and/or 911 in the second scan zone 901 may be formed as solidification lines at a section of powder separate from the AM build, this may allow for periodic and/or continuous monitoring of calibration either before, after and/or during a build process. Further, the abovementioned markings may also be formed within the build itself. For example, the determination may be made that the entire scan zone 901 and 902 is to be solidified for a layer of the AM build. Accordingly, markings 902, 903, 906, 907, and/or 912 in the first scan zone 902 and/or the series of markings 901, 908, 909, 910, and/or 911 in the second scan zone 901 may be formed as solidification lines, after which the scan lines may be read to determine a calibration state of the AM apparatus, once an offset determination is made and/or it is determined that the AM apparatus is within a calibration value, the rest of zones 901 and/or 902 may be filled-in/solidified to form a portion of the AM build; further, if an offset determination is made then the zones 901 and/or 902 may be formed using the new offset value to assure correct any misalignment of the build unit.

Figure 6:
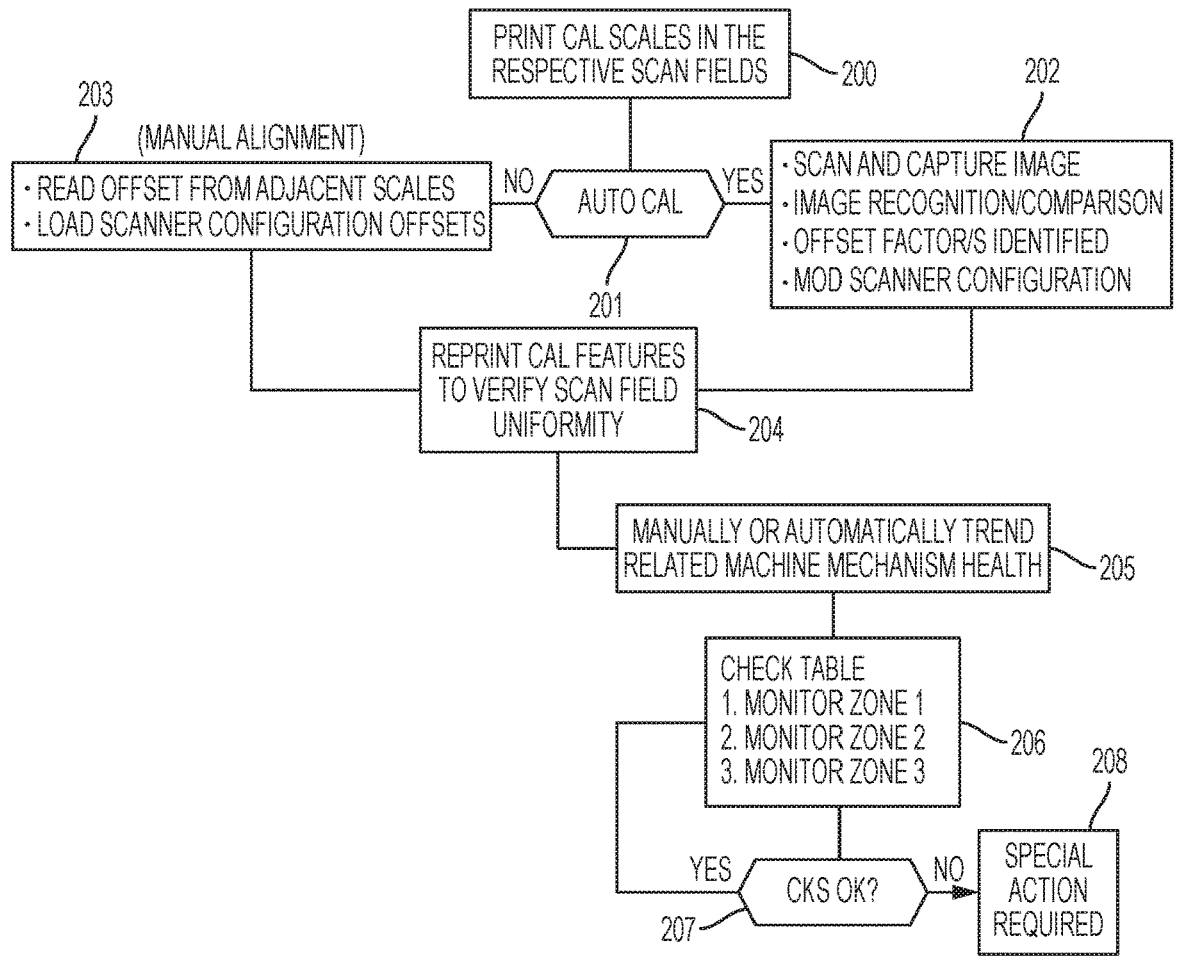
FIG. 6 is a flowchart showing one example of a calibration process of a large scale additive manufacturing machine in accordance with one aspect of the disclosure.

FIG. 6 shows an example flowchart of the current invention. As mentioned above, the calibration process in accordance with the invention may be carried out by an operator of the AM apparatus and/or the calibration may be either periodically and/or continuously monitored by a monitoring system. For example, in step 200 the calibration scales (e.g. markings 902, 903, 906, 907, and/or 912 in the first scan zone 902 and/or the series of markings 901, 908, 909, 910, and/or 911 in the second scan zone 901) may be formed as solidification lines. In the case of a manual calibration an operator of the AM apparatus may read an offset between the scan fields. Once a offset is read, an offset may be loaded into the AM apparatus control system based on the offset. The offset values may be read from a table, for example, and/or may be calculated based on the offset value. It is noted that the above process may further be performed by an alignment detection unit. The alignment detection unit may comprise any known visual-based sensor and/or density measurement sensor known in the art. The sensor may be connected to a computer and/or microcomputer for automatically detecting the alignment and/or offset of the markings. In step 204, after the appropriate offset value is applied to the operating parameters of the AM apparatus, the calibration features (e.g. markings 902, 903, 906, 907, and/or 912 in the first scan zone 902 and/or the series of markings 901, 908, 909, 910, and/or 911 in the second scan zone 901) may again be formed as solidification lines and read and/or detected to verify that scan fields are in acceptable alignment due to the incorporation of the offset values into the AM machine operating parameters.

In step 205, the detection of the AM apparatus solidification lines 902, 903, 906, 907, and/or 912 in the first scan zone 902 and/or the series of markings 901, 908, 909, 910, and/or 911 in the second scan zone 901 may be periodically or continuously stored and/or tracked to either manually or automatically generate trend data related to machine health. For example, once an offset value is incorporated into a specific AM machine operating perimeter, the abovementioned detection and offset value generation steps may be repeated at regular intervals; If the determination is an offset value had become too large and/or that offset values are gradually increasing with time, it may be determined that a component of the AM apparatus needs to be recalibrated, adjusted, and/or replaced. As mentioned above, in step 207 and 208, a determination may be made that a machine operation may continue using either no offset values or an offset value or if a portion of the AM apparatus does or will require a more intensive maintenance operation. Further, in step 206 for example, various portion of the build platform and/or table of the AM apparatus may be monitored continuously or periodically to determine if an offset value needs to be adjusted based on a misalignment at one portion of the table or build platform (e.g. zone 1) and a different misalignment detected at a second portion of the build platform or table (e.g. zone 2). As mentioned above, the various zones or portions of the build platform or table may be monitored and may be manually or automatically monitored as trend data over time to determine if a machine operation may continue using either no offset values or an offset value or if a portion of the AM apparatus does or will require a more intensive maintenance operation such as a calibration, adjustment and/or replacement, which is represented by step 208. Further, during normal operation of the AM apparatus, it may be determined that an operating perimeter requires a first offset value in a first portion of the table or build platform (e.g. zone 1) than a second portion of the table (e.g. zone 2), and the abovementioned offset values may be implemented into the machine operation during subsequent or during the current AM build. As mentioned above, the entire process mentioned above may be implemented though the automated formation of solidification lines, capturing an image of the alignment of the solidification lines. Based on the captured image, the image may be compared and/or the alignment may be detected and a offset factor computed by a microcomputer or computer. Once an offset value is determined, the galvanometer, electron beam, and/or laser source and/or irradiation source guiding device may be adjusted based on the offset value determination. The offset value determination and application may also be applied to other device operations, for example, the movement of the build and/or multiple build units (e.g. build units 400 and/or 302 as shown in FIGS. 2 and 3) and/or a build platform (e.g. platform 310 shown in FIG. 3).

Figure 7:
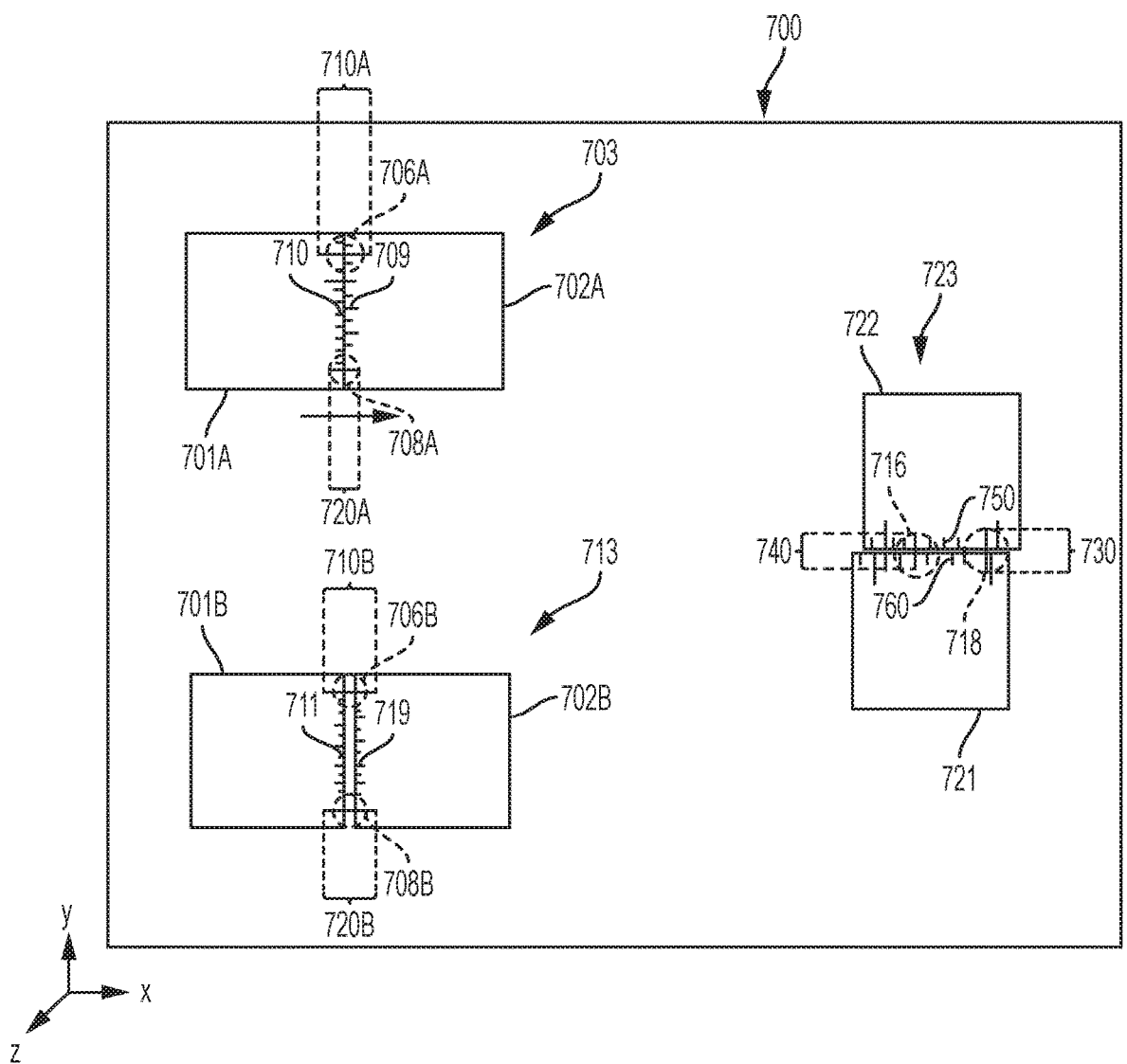
FIG. 7 is a top view showing several examples of an interlace calibration in accordance with one aspect of the disclosure.

FIG. 7 shows various scan zones examples of possible alignment issues from one scan zone to another. It is noted that the scan zones shown are solely for example purposes, and that one having ordinary skill in the art would understand that the examples shown are not exhaustive. Further, the alignment issues shown in FIG. 7 are exaggerated for illustration purposes. In order to calibrate the positioning system and/or the scanning system, as shown in FIG. 7, a first scan zone 701A may be formed with a series of markings as solidification lines 710 near a second scan zone 702A at two different positions of the same build unit or using two build units. A second scan zone 702A may be formed with a series of markings as solidification lines 709. As mentioned above, the series of solidification lines may be scales (e.g. Vernier scales) to be used to either visually (manually) and/or use a detector to determine an offset between the scan fields. The group of scan fields 703 shows an example situation where an observer of the scales and/or a detector/sensor and a computer may determine that no additional offset value is needed. As shown, the abovementioned solidification lines in portion 708A and 706B may be aligned which may represent that the two scan zones 701A and 702A are properly aligned in the Y direction. Further, the series of solidification in portions 708A and 708B may be of a known length. Thus, the determination may be made either visually (manually) and/or through the use a sensor/detector that lengths 710A and 720A are within the acceptable range. Accordingly, the determination may be made that the two scan zones 701A and 702A are properly aligned in the X direction requiring no offset value to be incorporated into the operating parameters of the AM apparatus. The abovementioned determinations may be made through following of the process represented in FIG. 6, for example.

As mentioned above, the abovementioned series of markings 708 and/or 710 may be formed as solidification lines in a Vernier scale. Forming the abovementioned solidification lines in a scale allows smaller deviations between each scan field to be detected without the need for significant magnification. The solidification lines may be spaced at a constant fraction of a fixed main scale as explained above. It is noted that while the abovementioned example discloses the scale formed as solidification lines as Vernier scale, the marking in each field may also be a single marking having an offset between the markings of each field being measured. Further, the scale and interval of the markings may be any desired pattern or scheme which would allow the offset of two or more adjacent or near-adjacent scan fields to be measured.

Further, It is noted that the markings 709 and/or 710 may be formed as solidification lines at a section of powder separate from the AM build, this may allow for periodic and/or continuous monitoring of calibration either before, after and/or during a build process. Further, the abovementioned markings may also be formed within the build itself. For example, the determination may be made that the entire scan zone 701A and 702A are to be solidified for a layer of the AM build. Accordingly, markings 710 in the first scan zone 701A and/or the series of markings 709 in the second scan zone 702A may be formed as solidification lines, after which the scan lines may be read to determine a calibration state of the AM apparatus, once an offset determination is made and/or it is determined that the AM apparatus is within a calibration value, the rest of zones 701A and/or 702A may be filled-in/solidified to form a portion of the AM build. In the example above, if it is determined that no offset value is required the zones 701A and/or 702A may be formed without any additional offset values being incorporated into the operating parameters as the portion of the AM build is solidified.

A second example set of scan zones 715 shows a possible misalignment between a first scan zone 701B and a second scan zone 702B. The first scan zone 701B may be formed with a series of markings as solidification lines 711 near a second scan zone 702B at two different positions of the same build unit or using two build units. A second scan zone 702B may be formed with a series of markings as solidification lines 719. As mentioned above, the series of solidification lines may be scales (e.g. Vernier scales) to be used to either read either visually (manually) and/or using a detector and/or sensor to determine an offset between the scan fields. The group of scan fields 713 shows an example situation where an observer of the scales and/or a detector/sensor and a computer may determine that an offset valued is needed to be incorporated into the operating parameters of either the scanning unit (e.g. galvanometer) and/or the positioning system for moving the build unit. As shown, the abovementioned solidification lines in portion 706B and 708B may be aligned which may represent that the two scan zones 701B and 702B are properly aligned in the Y direction. However, the series of solidification in portions 706B and 708B may be of a known length. Thus, the determination may be made either visually (manually) and/or through the use a sensor/detector that the lengths 710B and 720B are outside of the acceptable range. Accordingly, the determination may be made that the two scan zones 701B and 702B are not properly aligned in the X direction. The misalignment may be determined and an offset value may be incorporated into the operating parameters of the AM apparatus to compensate for the misalignment. The abovementioned determinations may be made through following of the process represented in FIG. 6, for example.

Similarly to the examples mentioned above, the markings 711 and/or 719 may be formed as solidification lines at a section of powder separate from the AM build, this may allow for periodic and/or continuous monitoring of calibration either before, after and/or during a build process. Further, the abovementioned markings may also be formed within the build itself. For example, the determination may be made that the entire scan zone 701B and 702B are to be solidified for a layer of the AM build. Accordingly, markings 711 in the first scan zone 701B and/or the series of markings 719 in the second scan zone 702B may be formed as solidification lines, after which the scan lines may be read to determine a calibration state of the AM apparatus, once an offset determination is made and/or it is determined that the AM apparatus is within a calibration value, the rest of zones 701A and/or 702A may be filled-in/solidified to form a portion of the AM build; further, if an offset determination is made then the zones 701A and/or 702A may be formed using the new offset value to assure correct any misalignment of the build unit.

A third example set of scan zones 723 shows a possible misalignment between a first scan zone 722 and a second scan zone 721. The first scan zone 722 may be formed with a series of markings as solidification lines 750 near a second scan zone 721 at two different positions of the same build unit or using two build units. A second scan zone 721 may be formed with a series of markings as solidification lines 760. As mentioned above, the series of solidification lines may be scales (e.g. Vernier scales) to be used to either read either visually (manually) and/or using a detector and/or sensor to determine an offset between the scan fields. The group of scan fields 723 shows an example situation where an observer of the scales and/or a detector/sensor and a computer may determine that an offset valued is needed to be incorporated into the operating parameters of either the scanning unit (e.g. galvanometer) and/or the positioning system for moving the build unit. As shown, the abovementioned solidification lines in portion 750 and 760 may be aligned at a portion 716 and 718 which may represent that the two scan zones 721 and 723 are not properly aligned in the X direction. However, the series of solidification lines in portions 716 and 718 may be of a known length. Thus, the determination may be made either visually (manually) and/or through the use a sensor/detector that the lengths 716 and 718 are within an acceptable range. Accordingly, the determination may be made that the two scan zones 723 and 721 are not properly aligned in the X and are properly aligned in the Y direction. The misalignment may be determined and an offset value may be incorporated into the operating parameters of the AM apparatus to compensate for the misalignment. The abovementioned determinations may be made through following of the process represented in FIG. 6, for example.

Similarly to the examples mentioned above, the markings 750 and/or 760 may be formed as solidification lines at a section of powder separate from the AM build, this may allow for periodic and/or continuous monitoring of calibration either before, after and/or during a build process. Further, the abovementioned markings may also be formed within the build itself. For example, the determination may be made that the entire scan zone 723 and 721 are to be solidified for a layer of the AM build. Accordingly, markings 750 in the first scan zone 723 and/or the series of markings 760 in the second scan zone 721 may be formed as solidification lines, after which the scan lines may be read to determine a calibration state of the AM apparatus, once an offset determination is made and/or it is determined that the AM apparatus is within a calibration value, the rest of zones 723 and/or 721 may be filled-in/solidified to form a portion of the AM build; further, if an offset determination is made then the zones 723 and/or 721 may be formed using the new offset value to assure correct any misalignment of the build unit.

This written description uses examples to disclose the invention, including the preferred embodiments, and also to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims. Aspects from the various embodiments described, as well as other known equivalents for each such aspect, can be mixed and matched by one of ordinary skill in the art to construct additional embodiments and techniques in accordance with principles of this application.

What is claimed is:

1. A method for calibrating an additive manufacturing apparatus comprising:
   forming a first solidified portion within a first scan region, wherein the first solidified portion within the first scan region is formed by irradiating a build material while a build unit is in a first location; and
   forming a second solidified portion within a second scan region, wherein the second solidified portion within the second scan region is formed by irradiating the build material while the build unit is in a second location different from said first location, wherein:
   the additive manufacturing apparatus is calibrated based on at least one of: a degree of offset of the first and second solidified portions, and a degree of overlap of the first and second solidified portions; and the first solidified portion comprises a first series of solidification lines and the second solidified portion comprises a second series of solidification lines, wherein the first and second series of solidification lines are formed as a Vernier scale.

2. The method of claim 1, wherein the build unit further comprises at least a first build unit and a second build unit, wherein the first build unit forms the first solidified portion within the first scan region, wherein the second build unit forms the second solidified portion in the second scan region.

3. The method of claim 1, wherein the method further comprises:
   determining an offset value by detecting the at least one of: the degree of offset of the first and second solidified portions, and the degree of overlap of the first and second solidified portions; and
   calibrating the additive manufacturing apparatus using the offset value.

4. The method of claim 3, wherein the method further comprises:
   applying the offset value to an operation of at least one of a galvanometer and a positioning device.

5. The method of claim 3, wherein the method further comprises:
   determining trend data based on a storing of the at least one of said degree of offset and said degree of overlap with relation to time;
   determining an operational state of at least one component of the additive manufacturing apparatus based on the trend data.

6. The method of claim 1, wherein the first and second solidified portions are formed by irradiating a layer of powder, wherein the first and second solidified portions are the only solidified portions formed in a first scan zone and a second scan zone in the layer of powder.

7. The method of claim 1, wherein the first and second solidified portions are formed by irradiating a layer of powder, wherein the first and second solidified portions are formed in a first scan zone and a second scan zone before a third solidified portion within the first scan zone or the second scan zone is formed.

8. A method for calibrating an additive manufacturing apparatus comprising:
   forming a first solidified portion within a first scan region, wherein the first solidified portion within the first scan region is formed by irradiating a build material while a build unit is in a first location;
   forming a second solidified portion within a second scan region, wherein the second solidified portion within the second scan region is formed by irradiating the build material while the build unit is in a second location different from said first location;
   detecting the first solidified portion and the second solidified portion; and
   determining an alignment of the additive manufacturing apparatus based on a detected alignment of the first solidified portion and the second solidified portion, wherein:
      the first solidified portion comprises a first plurality of solidified lines and the second solidified portion comprises a second plurality of solidified lines, wherein the first and second pluralities of solidified lines are formed as a Vernier scale.

9. The method of claim 8, wherein determination of an alignment of the additive manufacturing apparatus further comprises:
   determining which, of the first plurality of solidified lines, is in alignment with the second plurality of solidified lines, wherein an alignment of the build unit along a first axis is determined based on an alignment of at least one of the first plurality of solidified lines and at least one of the second plurality of solidified lines.

10. The method of claim 9, wherein the determination of the alignment of the build unit further comprises:
   determining a spacing between said at least one of the first plurality of solidified lines and the at least one of the second plurality of solidified lines, wherein an alignment of the build unit along a second d axis is determined based on said spacing.

11. The method of claim 8, wherein the method further comprises:
   determining an offset value by detecting the at least one of: the degree of offset of the first and second solidified portions, and the degree of overlap of the first and second solidified portions; and
   calibrating the additive manufacturing apparatus using the offset value.

12. The method of claim 11, wherein the method further comprises:
   applying the offset value to an operation of at least one of a galvanometer and a positioning device.

13. The method of claim 11, wherein the method further comprises:
   determining trend data based on a storing of the at least one of said degree of offset and said degree of overlap with relation to time;
   determining an operational state of at least one component of the additive manufacturing apparatus based on the trend data.

* * * * *